(12) United States Patent
Yeh et al.

(10) Patent No.: US 7,935,556 B2
(45) Date of Patent: May 3, 2011

(54) MICROELECTROMECHANICAL SYSTEM AND PROCESS OF MAKING THE SAME

(75) Inventors: Li-Ken Yeh, Hsinchu (TW); I-Hsiang Chiu, Hsinchu (TW)

(73) Assignee: Memsmart Semiconductor Corp., Hsinchu (TW)

( * ) Notice: Subject to any disclaimer, the term of this patent is extended or adjusted under 35 U.S.C. 154(b) by 0 days.

(21) Appl. No.: 11/845,780

(22) Filed: Aug. 27, 2007

(65) Prior Publication Data

US 2009/0057817 A1    Mar. 5, 2009

(51) Int. Cl.
*H01L 21/00* (2006.01)
(52) U.S. Cl. .............. 438/52; 257/415; 216/2
(58) Field of Classification Search .......... 438/52, 438/50; 216/2; 257/415, 417, 418
See application file for complete search history.

(56) References Cited

U.S. PATENT DOCUMENTS

| | | | | |
|---|---|---|---|---|
| 5,963,788 A * | 10/1999 | Barron et al. | | 438/48 |
| 6,064,118 A * | 5/2000 | Sasaki | | 257/758 |
| 6,218,282 B1 * | 4/2001 | Buynoski | | 438/619 |
| 7,138,694 B2 * | 11/2006 | Nunan et al. | | 257/419 |
| 2002/0148807 A1* | 10/2002 | Zhao et al. | | 216/2 |
| 2004/0077178 A1* | 4/2004 | Yang et al. | | 438/710 |
| 2006/0105543 A1* | 5/2006 | Xiao et al. | | 438/459 |

* cited by examiner

*Primary Examiner* — Kiesha R Bryant
*Assistant Examiner* — Mark W Tornow
(74) *Attorney, Agent, or Firm* — CKC & Partners Co., Ltd.

(57) ABSTRACT

A micro electromechanical system and a fabrication method thereof, which has trenches formed on a substrate to prevent circuits from interfering each other, and to prevent over-etching of the substrate when releasing a microstructure.

4 Claims, 8 Drawing Sheets

MICROELECTROMECHANICAL SYSTEM AND PROCESS OF MAKING THE SAME

BACKGROUND OF THE INVENTION

1. Field of the Invention

The present invention relates generally to a microelectromechanical system (MEMS), and more particularly to a MEMS and process of making the same for lowering interference.

2. Description of the Prior Art

A microelectromechanical system (MEMS) is a combination of surface and bulk micromachining technologies, and has been widely applied in mechanical filters, accelerometers, gyroscopes, optic modulators, and radio frequency (RF) passive devices. Generally, a MEMS comprises circuits and microstructures. U.S. Pat. No. 5,717,631 proposed a MEMS structure and process of making the same, which had the disadvantage of the generation of an undercut on a substrate under circuits or other structures adjacent to the microstructure during the release of the microstructure, thus the processing parameters must be precisely controlled in order to prevent over-etching from occurring, and protect the substrate under circuits or other structures adjacent to the microstructure from being damaged due to excessive undercut. In addition, noises generated from different circuits would be transmitted via the substrate and lead to interference between the circuits. Conventionally, such interference is prevented by using guard rings, or by allocating circuits that are prone to generating noises away from other circuits. However, the guard rings block noises by forming wells on the substrate, and its effect of blocking off noises is limited, while allocating circuits that are prone to generating noises away from other circuits requires the use of chips with larger surface area, which increases further costs for manufacturing and impedes the aim of miniaturization.

Therefore, it is desired a MEMS and process of making the same that do not increase manufacturing costs, may lower interference between circuits thereof, and may prevent over-etching.

SUMMARY OF THE INVENTION

An object of the present invention is to provide a MEMS with low interference, and process of making the same.

Another object of the present invention is to provide a MEMS and process of making the same that may prevent substrates from over-etching.

A MEMS according to the present invention comprises a microstructure, a circuit, and a trench located therebetween for separating the microstructure and the circuit, so as to protect performance of the circuit from deteriorating due to over-etching during the release of the microstructure.

A MEMS according to the present invention comprises a structural region having a microstructure, a circuitry region having two circuits, and a trench located between the two circuits for separating the two circuits, so as to prevent the circuits from interfering each other.

A process of making a MEMS according to the present invention comprises a pre-process to form a microstructure and a circuit on a substrate, a metal layer on a top surface of the microstructure and the circuit, and an insulation layer covering over the microstructure and the circuit, a first etching process for removing a portion of the insulation layer not covered by the metal layer, a second etching process for removing a portion of the substrate not covered by the metal layer, forming a mask on the substrate for covering over the circuit and exposing the microstructure, and a third etching process for releasing the microstructure from the substrate.

A method for fabricating a MEMS according to the present invention comprises a pre-process to form a microstructure and a circuit on a substrate, and an insulation layer covering over the microstructure and the circuit, forming a first mask on the insulation layer for covering the microstructure and the circuit, performing a first etching process for removing parts of the insulation layer not covered by the first mask, performing a second etching process for removing parts of the substrate not covered by the first mask, forming a second mask on the substrate for covering the circuit and exposing the microstructure, and performing a third etching process for releasing the microstructure.

In the present invention, the interference between the circuits may be lowered via the trenches located between the circuits, so that interference within the MEMS may be minimized. In addition, the over-etching of the substrate may be prevented via the trenches located between the microstructures and the circuits, so as to protect the properties of the circuits from deteriorating and reduce the interference between the circuits and the microstructures. Because the trenches are generated during the release of the microstructures, the aim of releasing microstructures, lowering interference, and preventing over-etching may be achieved simultaneously without increasing the complexity and costs of the manufacturing process thereof.

BRIEF DESCRIPTION OF THE DRAWINGS

The present invention can be more fully understood by reading the subsequent detailed description and examples with references made to the accompanying drawings; wherein.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
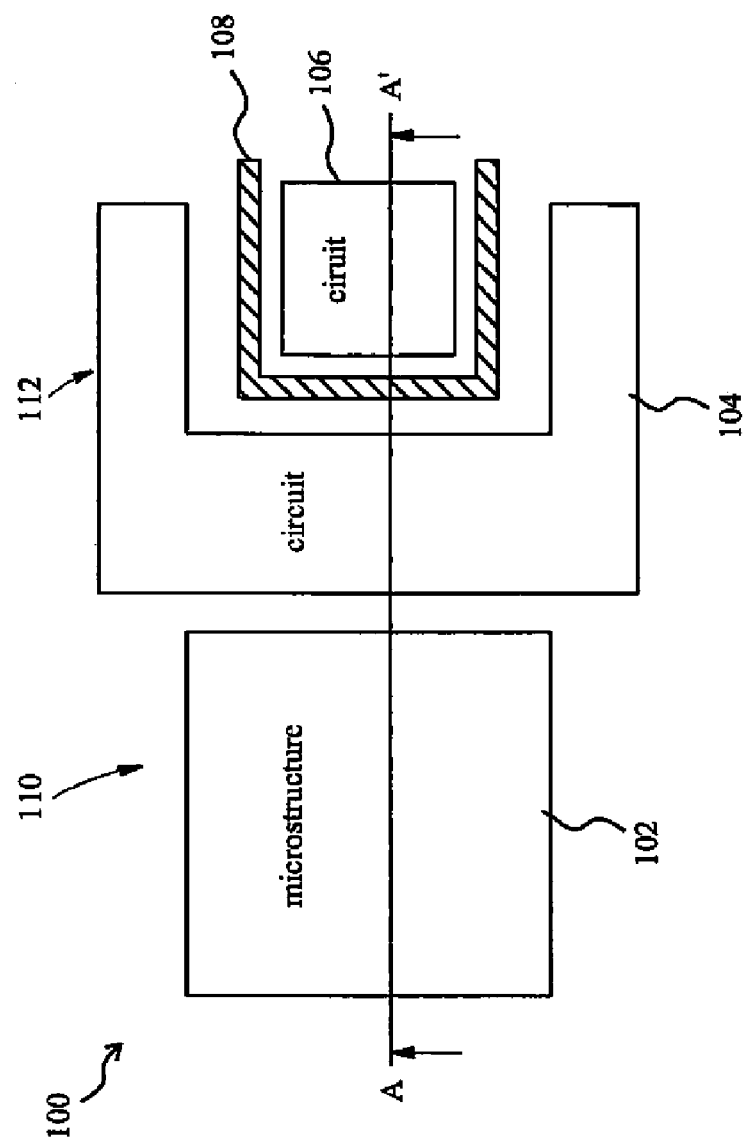
FIG. 1 schematically shows a first embodiment according to the present invention.

FIG. 1 shows a first embodiment of the present invention, in which a MEMS 100 comprises a structural region 110 having a microstructure 102, a circuitry region 112 having circuits 104 and 106, and a trench 108 located between the circuit 104 and the circuit 106 for separating the circuits 104 and 106 to prevent the circuits 104 and 106 from interfering each other. In an example, the circuit 106 is a digital circuit or other types of circuits that are prone to cause noises (such as an oscillator), and noises generated from such circuits are cut off by the trench 108, so that the noises would not be transmitted via the substrate and allowed to reach other circuits (such as the circuit 104) within the circuitry region 112, and thus the interference within the MEMS 100 may be effectively lowered. In another example, the circuit 106 is the circuit that needs to be protected from the interference of noises, and noises generated from other circuits (such as the circuit 104) within the circuitry region 112 may be cut off by the trench 108, and the circuit 106 is protected from the interference of noises.

Figure 2:
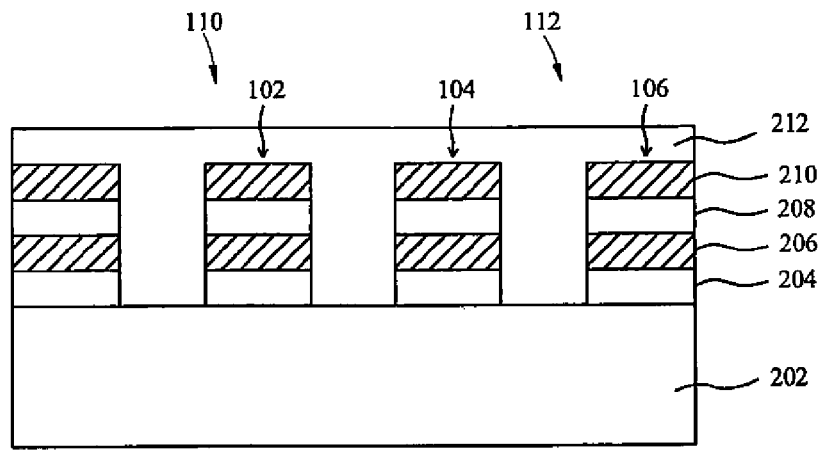
FIG. 2 shows a schematic view after a pre-process is performed.
Figure 3:
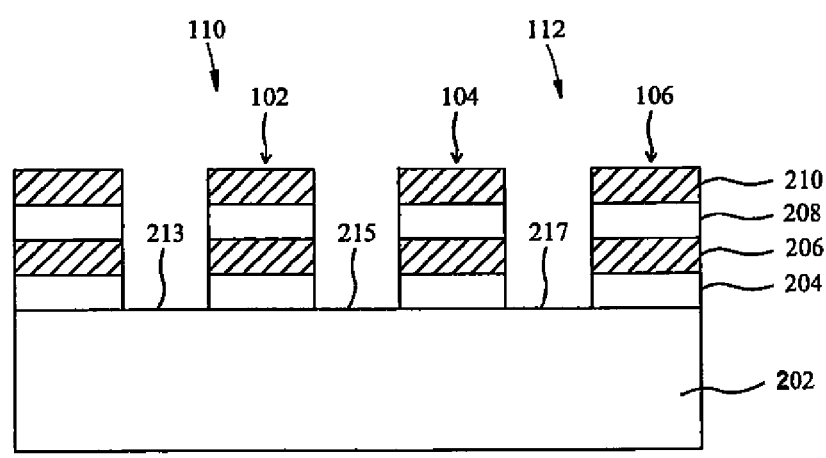
FIG. 3 shows a schematic view after the surface of the substrate is exposed.
Figure 4:
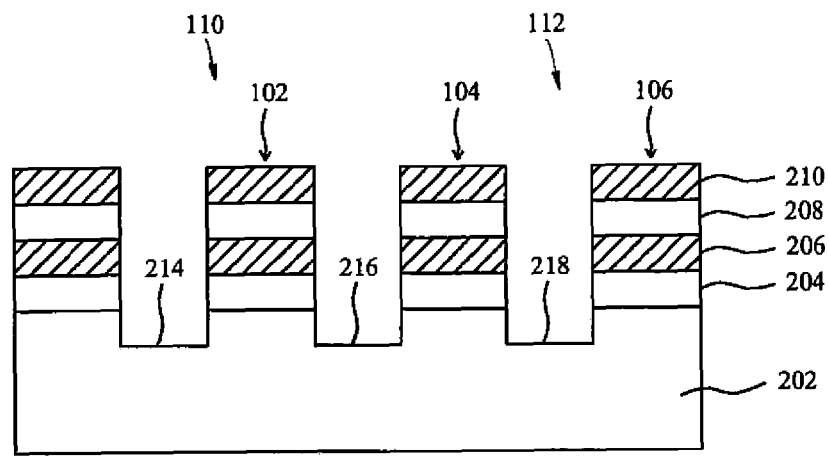
FIG. 4 shows a schematic view after the trench is formed.
Figure 5:
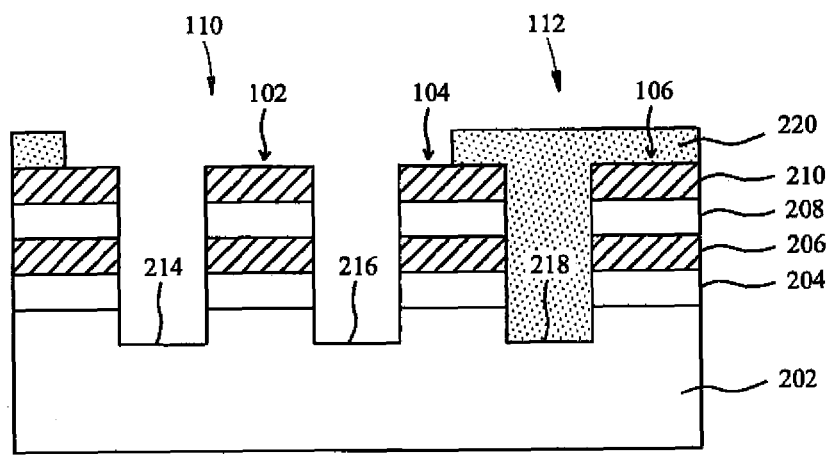
FIG. 5 shows a schematic view after the mask is formed.
Figure 6:
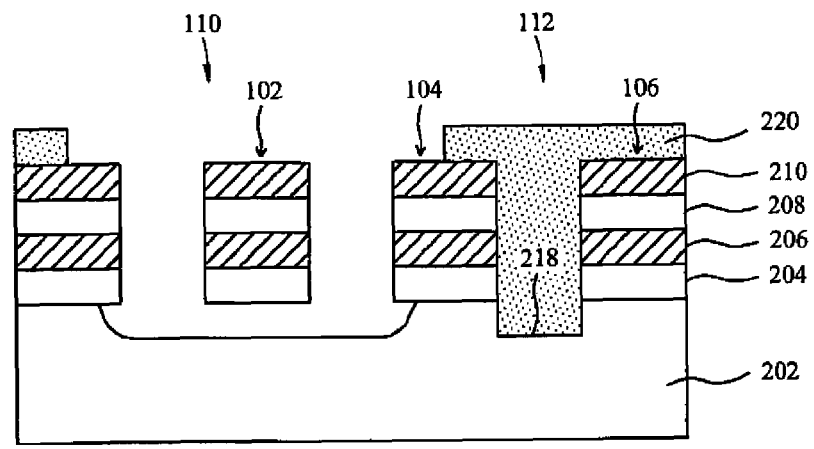
FIG. 6 shows a schematic view after the microstructure is released.
Figure 7:
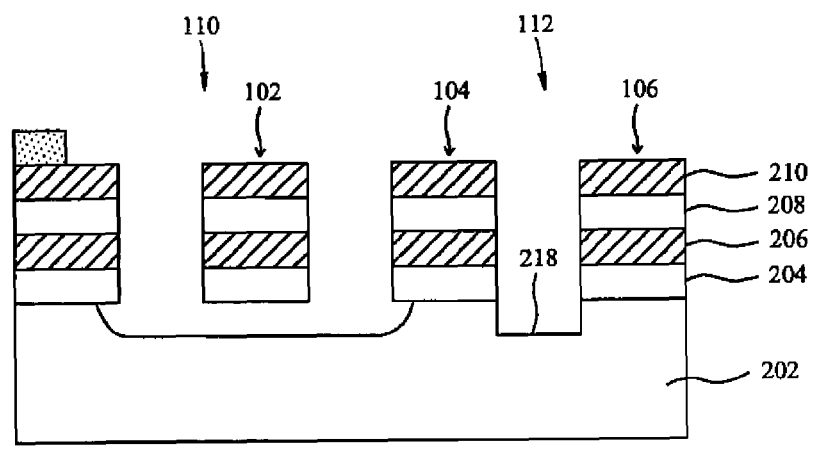
FIG. 7 shows a schematic view after the mask is removed.

FIGS. 2 to 7 show the embodiments of the present invention for fabricating a MEMS, in which the structure of the MEMS is illustrated in a cross-section cut across the direction of A-A' in FIG. 1. Referring to FIG. 2, a pre-process is performed to form a MEMS structure on a substrate 202, and the pre-process may be a CMOS process, so that a microstructure 102, circuits 104 and 106 are formed on the substrate 202, and an insulation layer 212 (such as an oxide layer) is also formed for covering the microstructure 102 and the circuits 104, 106. The microstructure 102 is located inside of a structural region 110, and the circuits 104, 106 are located inside of a circuitry region 112. The microstructure 102 and the circuits 104, 106 are comprised of an insulation layer 204 (such as an oxide layer), a metal layer 206, an insulation layer 208 (such as an oxide layer), and a metal layer 210. Referring to FIG. 3, an etching process, such as the anisotropic etching process, is carried out according to the metal layer 210, so as to remove parts of the insulation layer 212 not covered by the metal layer 210, and expose surfaces 213, 215, and 217 of the substrate 202, the microstructure 102, and the circuits 104 and 106. Referring to FIG. 4, an etching process, such as the anisotropic etching process, is carried out according to the metal layer 210, so as to remove parts of the substrate 202 not covered by the metal layer 210, and allow grooves 214, 216, and 218 to form. Referring to FIG. 5, a mask 220 is formed on the substrate 202 for exposing the microstructure 102 and the grooves 214, 216. Referring to FIG. 6, an etching process, such as the isotropic etching process, is carried out according to the mask 220, so as to release the microstructure 102 from the substrate 202 in order to form a suspended structure. Referring to FIG. 7, the mask 220 is removed in order to form the structure shown in FIG. 1, the groove 218 is the trench 108 shown in FIG. 1. In this embodiment, the groove 218 is formed during the release of the microstructure 102, and thus a MEMS that has low interference may be formed via the existing fabrication process. In an embodiment, the mask 220 is formed by forming an insulation layer (such as a photoresist layer) over the substrate 202 and patterning the insulation layer.

Figure 8:
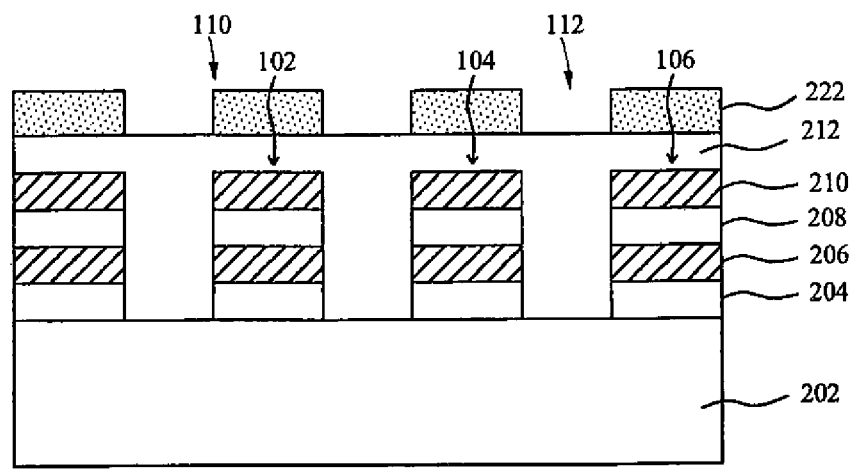
FIG. 8 shows a schematic view after the mask is formed on the insulation layer.
Figure 9:
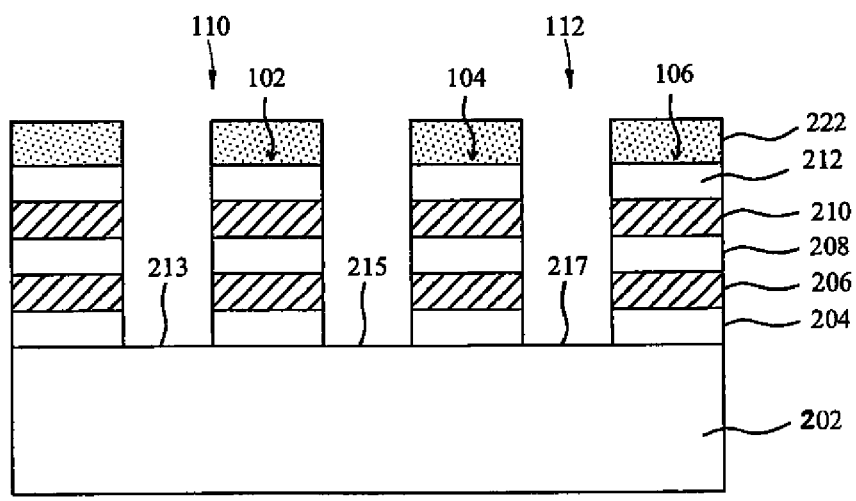
FIG. 9 shows a schematic view after the surface of the substrate is exposed.
Figure 10:
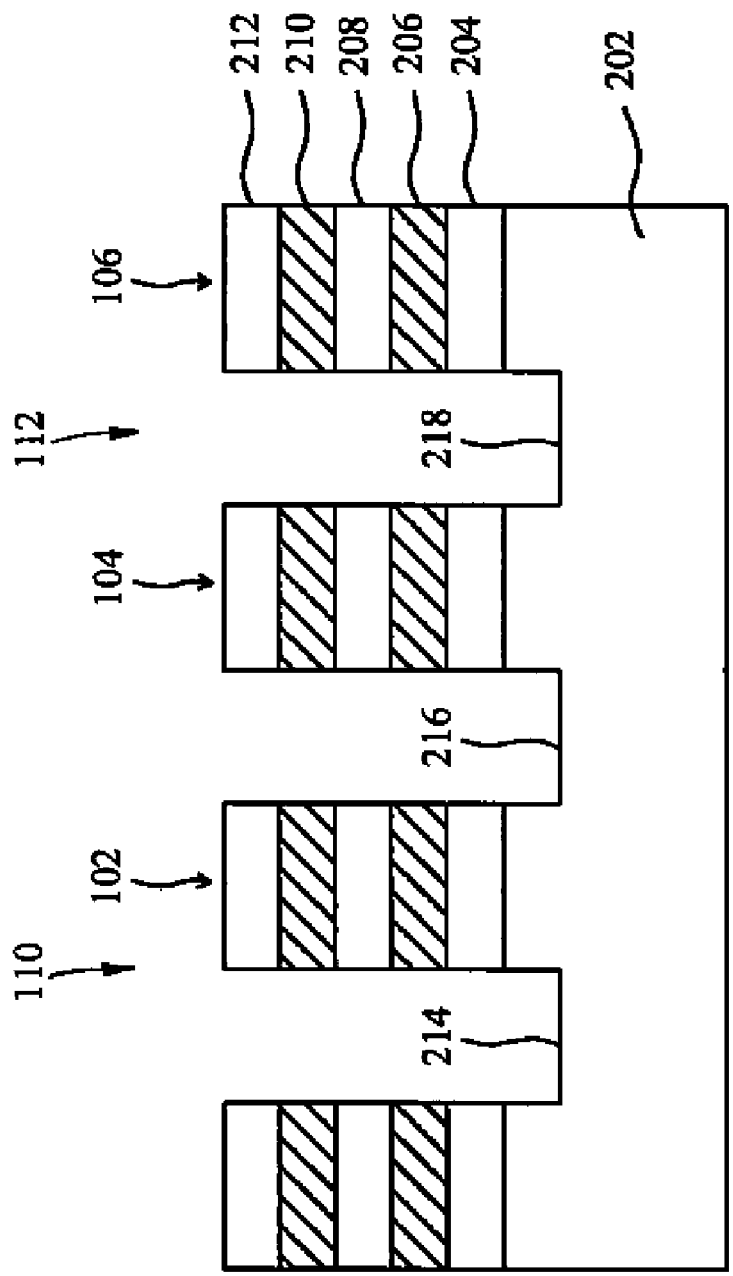
FIG. 10 shows a schematic view after the trench is formed.

In a different embodiment, the grooves 214, 216, and 218 may be formed via the steps shown in FIGS. 8 to 10. Referring to FIG. 8, a mask 222 is formed on the insulation layer 212 after the pre-process is completed, so as to cover the microstructure 102 and the circuits 104, 106. Referring to FIG. 9, an etching process, such as the anisotropic etching process, is carried out according to the mask 222, so as to remove parts of the insulation layer 212 not covered by the mask 222, and expose surfaces 213, 215, and 217 of the substrate 202. Referring to FIG. 10, an etching process, such as the anisotropic etching process, is carried out according to the mask 222, so as to remove parts of the substrate 202 not covered by the mask 222, and allow grooves 214, 216, and 218 to form, and the mask 222 is removed subsequently to expose the microstructure 102 and the circuits 104, 106. As the microstructure 102 is released according to the steps shown in FIGS. 5 to 7, the trench 108 shown in FIG. 1 is formed as a result. Because the trench 108 of FIG. 1 is formed during the release of the microstructure 102, a MEMS that has low interference may be formed via the existing fabrication process. In an embodiment of the present invention, the mask 222 is formed by forming an insulation layer (such as a photoresist layer) over the insulation layer 212 and patterning this newly-formed insulation layer.

Figure 11:
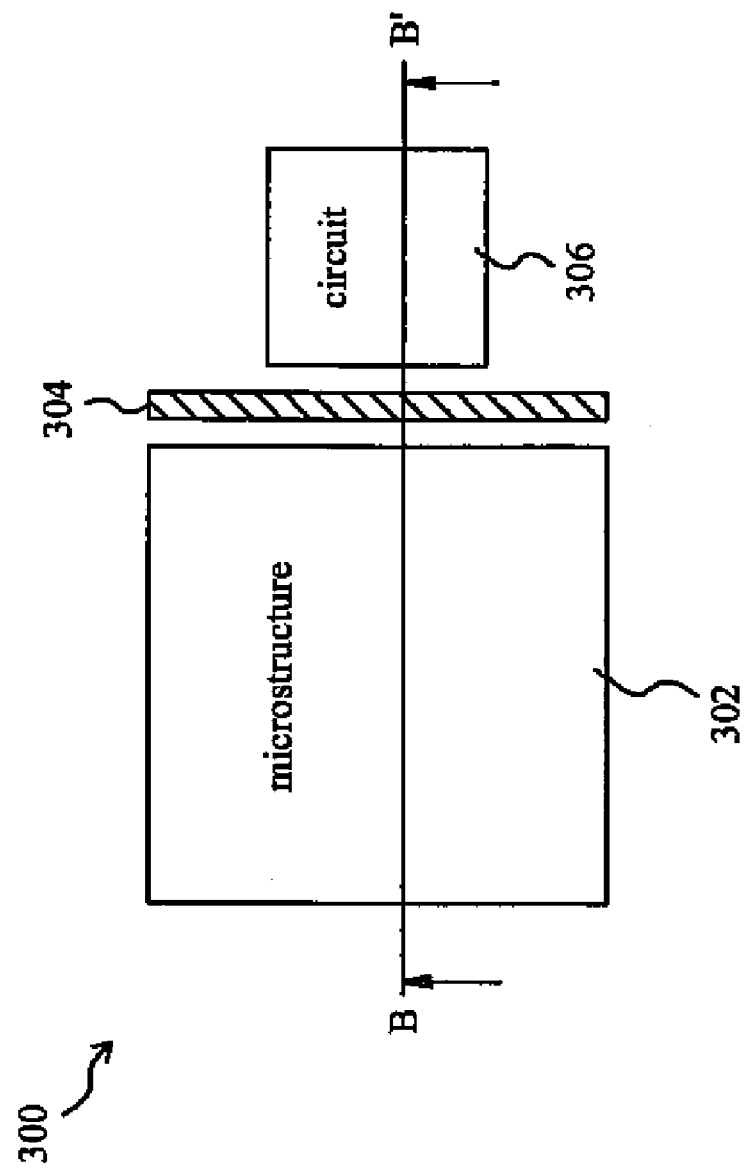
FIG. 11 schematically shows a second embodiment according to the present invention.

FIG. 11 shows a second embodiment of the present invention, a MEMS 300 comprises a microstructure 302, a circuit 306, and a trench 304 located therebetween for separating the microstructure 302 and the circuit 306, so as to protect the properties of the circuit 306 from deteriorating due to over-etching during the release of the microstructure 302, and reduce the interference between the circuit 306 and the microstructure 302.

Figure 12:
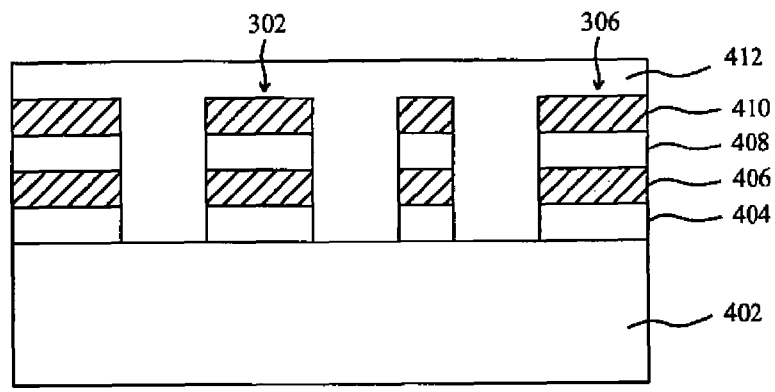
FIG. 12 shows a schematic view after a pre-process is performed.
Figure 13:
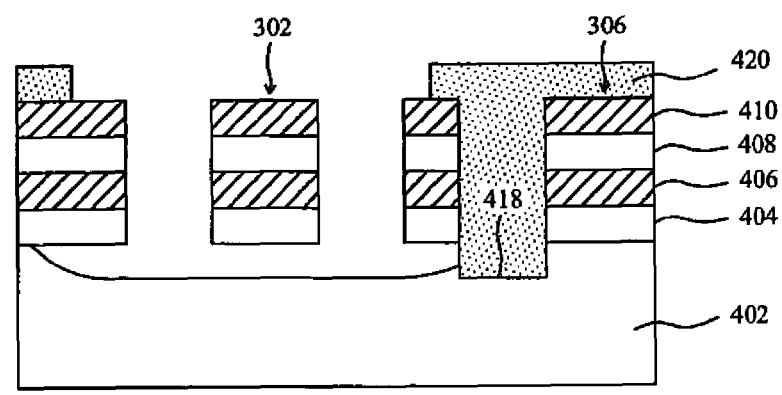
FIG. 13 shows a schematic view after the microstructure is released.

The structure of the MEMS 300 and fabrication method thereof is illustrated in a cross-section cut across the direction of B-B' in FIG. 11. Referring to FIG. 12, a pre-process is performed to form a MEMS structure on a substrate 402, and the pre-process may be a CMOS process, so that a microstructure 302, a circuit 306, and an insulation layer 412 (such as an oxide layer) for coverage thereon are formed on the substrate 402. The microstructure 302 and the circuit 306 are comprised of an insulation layer 404 (such as an oxide layer), a metal layer 406, an insulation layer 408 (such as an oxide layer), and a metal layer 410. The subsequent fabrication processes are shown in FIGS. 3 to 10 and will not be repeated here. A groove 418 indicated in FIG. 13 is the trench 304 shown in FIG. 11, and it should be noted that when the microstructure 302 is released, horizontal etching of the substrate 402 will be stopped by a mask 420 within the groove 418. As a result, even if the control over the processing parameters is poor (for example, excessive time of etching) during the release of the microstructure 302, the undercut would not occur in the substrate under the circuit 306, and thus over-etching may be effectively prevented.

In different embodiments, the trench may be located between the microstructure and the circuit, or between different circuits, or any regions that needs to be isolated from other regions, and corresponding structures may be generated via the pre-process. The required trenches may be formed via the steps shown in FIGS. 3 to 7, so as to simultaneously achieve the aim of releasing the microstructure, reducing interference, and preventing over-etching.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for fabricating a microelectromechanical system, comprising the steps of:

forming a microstructure, a circuit, and an insulation layer covering a microstructure and a circuit on a substrate by a pre-process, and a metal layer is formed on a top of the microstructure and the circuit formed in this process;

removing parts of the insulation layer not covered by the metal layer by a first etching process;

removing parts of the substrate not covered by the metal layer and form grooves between the microstructure and the circuit by a second etching process after the first etching process;

forming a mask on the substrate to cover the circuit and completely fill the grooves and expose the microstructure after the second etching process; and releasing the microstructure from the substrate by a third etching process after the mask is formed on the substrate.

2. The method of claim 1, wherein the pre-process is a CMOS process.

3. The method of claim 1, wherein the step of forming the mask comprises the steps of:

forming a second insulation layer to cover the substrate; and patterning the second insulation layer to form the mask.

4. The method of claim 2, wherein the second insulation layer is a photoresist layer.

\* \* \* \* \*